US012781385B2

(12) United States Patent
Cao et al.

(10) Patent No.: US 12,781,385 B2
(45) Date of Patent: Nov. 3, 2026

(54) SEED CRYSTAL LIFTING DEVICE AND SINGLE CRYSTAL FURNACE

(71) Applicant: ZHEJIANG JINGSHENG M&E CO., LTD, Shaoxing (CN)

(72) Inventors: Jianwei Cao, Shaoxing (CN); Liang Zhu, Shaoxing (CN); Linjian Fu, Shaoxing (CN); Gangfei Ye, Shaoxing (CN); Junfu Ni, Shaoxing (CN); Yuchao Wu, Shaoxing (CN); Tianbao Jin, Shaoxing (CN)

(73) Assignee: ZHEJIANG JINGSHENG M & E CO., LTD, Shaoxing (CN)

( * ) Notice: Subject to any disclaimer, the term of this patent is extended or adjusted under 35 U.S.C. 154(b) by 427 days.

(21) Appl. No.: 18/271,854

(22) PCT Filed: May 17, 2023

(86) PCT No.: PCT/CN2023/094768
§ 371 (c)(1),
(2) Date: Jul. 12, 2023

(87) PCT Pub. No.: WO2024/139017
PCT Pub. Date: Jul. 4, 2024

(65) Prior Publication Data
US 2024/0410076 A1 Dec. 12, 2024

(30) Foreign Application Priority Data
Dec. 30, 2022 (CN) ......................... 202211725100.1

(51) Int. Cl.
*C30B 15/30* (2006.01)
*C30B 29/06* (2006.01)

(52) U.S. Cl.
CPC ............. *C30B 15/30* (2013.01); *C30B 29/06* (2013.01)

(58) Field of Classification Search
CPC ................................ C30B 29/06; Y02P 70/50
See application file for complete search history.

(56) References Cited

U.S. PATENT DOCUMENTS 5,910,216 A * 6/1999 Nakamura .............. C30B 15/32 117/911
2010/0242625 A1* 9/2010 Korb ...................... G01G 19/18 73/862.42
2013/0319318 A1* 12/2013 Suda ....................... C30B 15/30 117/208

FOREIGN PATENT DOCUMENTS

CN 1280634 A 1/2001
CN 208455108 U 2/2019
(Continued)

OTHER PUBLICATIONS

International Search Report of PCT/CN2023/094768.
First notice of examination opinions of CN202211725100.1.

*Primary Examiner* — Hua Qi

(57) ABSTRACT

A seed crystal lifting device (100) and a single crystal furnace (200) are provided. The seed crystal lifting device (100) is applied in the single crystal furnace (200), including a frame (1), a cable pipe (4), and a driving component (5). The frame (1) is disposed at a top of the single crystal furnace (200). The cable pipe (4) is movably disposed on the frame (1), and a peripheral wall of the cable pipe (4) is configured to wind a seed crystal rope. The driving component (5) is disposed to the frame (1) and configured to drive the cable pipe (4) to rotate around an axis of the cable pipe (4) and slide along a vertical direction at the same time to wind and lift the seed crystal rope.

8 Claims, 10 Drawing Sheets

(56) References Cited

FOREIGN PATENT DOCUMENTS

| | | | | | |
|---|---|---|---|---|---|
| CN | 111204668 | A | | 5/2020 | |
| CN | 111204669 | A | | 5/2020 | |
| CN | 111265055 | A | * | 6/2020 | ........... A47C 19/045 |
| CN | 112442733 | A | | 3/2021 | |
| CN | 212669045 | U | | 3/2021 | |
| CN | 114250509 | A | | 3/2022 | |
| CN | 114836824 | A | | 8/2022 | |
| CN | 115287747 | A | | 11/2022 | |
| CN | 218951558 | U | | 5/2023 | |
| KR | 102396348 | B1 | | 5/2022 | |

* cited by examiner

SEED CRYSTAL LIFTING DEVICE AND SINGLE CRYSTAL FURNACE

CROSS-REFERENCE TO RELATED APPLICATIONS

This application is an U.S. national phase application under 35 U.S.C. § 371 based upon international patent application No. PCT/CN2023/094768, filed on May 17, 2023, which itself claims priority to Chinese patent application No. 202211725100.1, filed on Dec. 30, 2022, titled "SEED CRYSTAL LIFTING DEVICE AND SINGLE CRYSTAL FURNACE". The contents of the above identified applications are hereby incorporated herein in their entireties by reference.

TECHNICAL FIELD

The present disclosure generally relates to a field of pulling monocrystalline silicon, and in particular, to a seed crystal lifting device and a single crystal furnace.

BACKGROUND

A seed crystal lifting device of a single crystal furnace needs to drive a cable pipe to move horizontally toward one side while rotating, so as to wind, store and lift a seed crystal rope. A center of gravity of the entire seed crystal lifting device shifts to one side and the cable pipe moves horizontally at the same time, thus reducing stability of the seed crystal lifting device and lowering quality of products.

The seed crystal lifting device in the related art is provided with a counterweight structure to ensure the stability of the seed crystal lifting device. However, an overall size and weight of the seed crystal lifting device can be greater due to the counterweight structure.

SUMMARY

According to various embodiments of the present disclosure, a seed crystal lifting device and a single crystal furnace are provided.

The present disclosure provides a seed crystal lifting device applied in a single crystal furnace. The seed crystal lifting device includes a frame, a cable pipe, and a driving component. The frame is disposed at a top of the single crystal furnace. The cable pipe is movably disposed on the frame, and a peripheral wall of the cable pipe is configured to allow a seed crystal rope to wind. The driving component is disposed on the frame and configured to drive the cable pipe to rotate around an axis of the cable pipe and slide along a vertical direction at the same time, to wind and lift the seed crystal rope.

In some embodiments, the frame includes a side wall and a block protruding from an inside of the side wall, and the block is configured to press the seed crystal rope to the cable pipe. The side wall of the frame is provided with a line inlet, and a center of the block and a center of the line inlet are located in the same horizontal plane.

In some embodiments, the seed crystal lifting device further includes a screw and a nut. The screw is fixed on the frame and extends along the vertical direction. The nut is sheathed on the screw and matched with the screw via a helix, and the cable pipe is fixed to the nut along a same axis.

In some embodiments, the peripheral wall of the cable pipe is provided with a spiral groove which is configured to allow the seed crystal rope to wind. A helix of the spiral groove is in a same direction of rotation as the helix of the screw, and a pitch of the spiral groove is equal to a pitch of the screw.

In some embodiments, the driving component includes a driving shaft and a guide member, and the guide member extends along the vertical direction. The cable pipe is provided with a guide hole through the cable pipe along the vertical direction eccentrically. The guide member is slidably inserted in the guide hole, and the driving shaft is configured to drive the guide member to further drive the cable pipe to rotate around the screw.

In some embodiments, the driving component further includes a first connecting member disposed at an end of the guide member along the vertical direction, the driving shaft is disposed at an end of the first connecting member away from the guide member, and an axis of the driving shaft and an axis of the screw are coaxial.

In some embodiments, the driving component further includes a second connecting member disposed at an end of the guide member away from the first connecting member. The second connecting member is provided with a hole through the second connecting member along the vertical direction, and the screw is rotatably inserted in the hole.

In some embodiments, the driving component further includes a driving member disposed outside the frame, and the driving member is configured to drive the driving shaft. The seed crystal lifting device further includes a limiting component disposed outside the frame, and the driving member is further configured to drive the limiting component to rotate in synchronization with the driving shaft.

In some embodiments, the driving component further includes a guide sleeve embedded on an inner wall of the guide hole. The guide sleeve is slidably connected to the guide member, and a length of the guide sleeve along the vertical direction is less than a length of the cable pipe along the vertical direction.

In some embodiments, the seed crystal lifting device further includes either or both of the following structures. The seed crystal lifting device further includes a limiting member disposed in the frame, and the limiting member includes a first limiting portion configured to fix the screw. The seed crystal lifting device further includes a limiting member disposed in the frame, and the limiting member includes a second limiting portion configured to axially limit the driving component.

In some embodiments, the seed crystal lifting device further includes a guide component located at a side of the cable pipe along a horizontal direction, and the guide component is configured to guide the seed crystal rope extending along the vertical direction to extend along the horizontal direction to the cable pipe.

The present disclosure further provides a single crystal furnace, which includes the above seed crystal lifting device.

The details of one or more embodiments of the present disclosure are set forth in the accompanying drawings and the description below. Other features, objects and advantages of the present disclosure will become apparent from the description, drawings and claims.

BRIEF DESCRIPTION OF THE DRAWINGS

In order to more clearly illustrate the technical solutions in the embodiments of the present disclosure or in the conventional technology, the following will briefly describe the accompanying drawings used in the description of the embodiments or conventional technology. It is obvious that for those of ordinary skill in the art, the accompanying drawings in the following description are only some embodiments of the present disclosure, and other drawings can be obtained according to these accompanying drawings without creative work.

Figure 1:
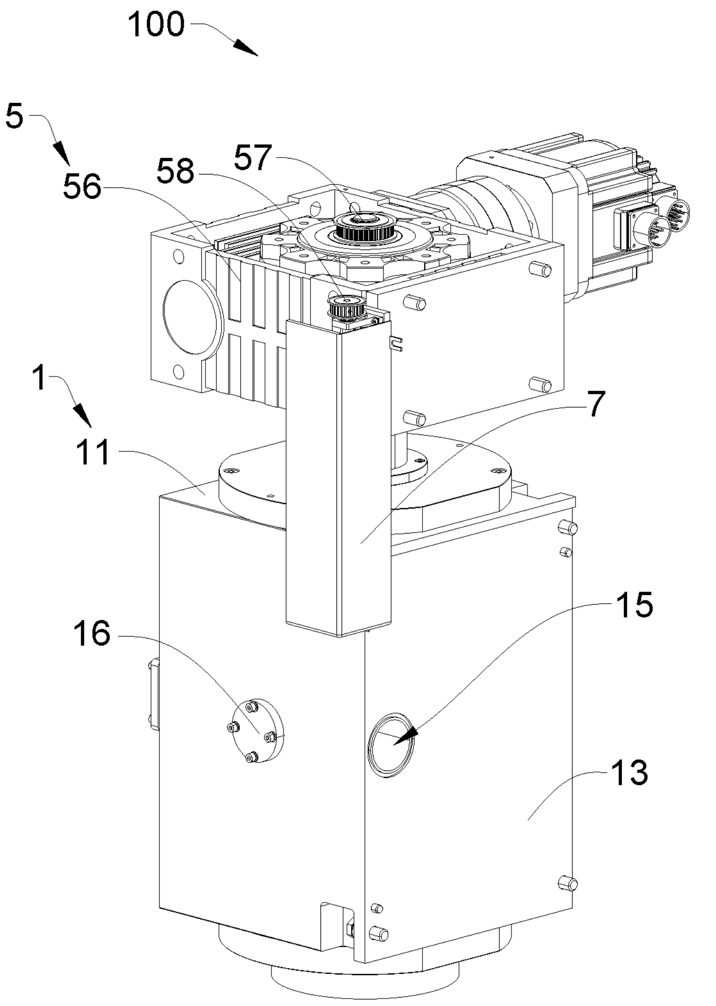
FIG. 1 is a partial perspective view of a seed crystal lifting device according to one or more embodiments of the present disclosure.

In the figures, 100 represents a seed crystal lifting device, 1 represents a frame, 11 represents a first bracket, 111 represents a step portion, 12 represents a second bracket, 13 represents a side wall, 14 represents a lift cavity, 15 represents a line inlet, 16 represents a block, 17 represents an access port, 2 represents a screw, 21 represents a limiting end, 211 represents a groove, 3 represents a nut, 4 represents a cable pipe, 41 represents a guide hole, 42 represents a spiral groove, 43 represents an avoidance hole, 5 represents a driving component, 51 represents a driving shaft, 52 represents a guide member, 53 represents a first connecting member, 54 represents a second connecting member, 541 represents a hole, 55 represents a guide sleeve, 56 represents a driving member, 57 represents a first pulley, 58 represents a second pulley, 6 represents a limiting member, 61 represents a first limiting portion, 611 represents a limiting hole, 612 represents a protrusion, 62 represents a second limiting portion, 7 represents a limiting component. 8 represents a guide component, 81 represents a first sheave, 82 represents a second sheave, 83 represents a housing, and 200 represents a single crystal furnace.

DETAILED DESCRIPTION OF THE EMBODIMENT

In order to make objects, features and advantages of the present disclosure more clearly understood, the specific embodiments of the present disclosure are described in detail below with reference to the accompanying drawings. Numerous specific details are set forth in the following description to facilitate a sufficient understanding of the present disclosure. However, the present disclosure can be implemented in many other ways different from those described herein, and a person skilled in the art may perform similar improvements without departing from the connotation of the present disclosure, and therefore, the present disclosure is not limited by the specific embodiments disclosed below.

It should be noted that when an element is considered to be "fixed to" or "disposed on" another element, it can be directly fixed to or disposed on another element, or there can be a centered element. When an element is considered to be "connected to" another element, it can be directly connected to another element, or there can be a centered element. Terms used in the specific embodiments "vertical", "horizontal", "above", "below", "left", "right", and other similar words as used in the present disclosure are for illustrative purposes only and do not indicate the sole embodiment.

In addition, the terms "first" and "second" are only used for descriptive purposes, and cannot be understood as indicating or implying relative importance or implying the number of indicated technical features. Thus, features delimited with "first", "second" may expressly or implicitly include at least one of the features. In the description of the present disclosure, unless expressly and specifically defined otherwise, "plurality" means at least two, such as two, three, etc.

In the present application, unless otherwise explicitly specified and defined, the expression a first feature being "on" or "underneath" a second feature may be the case that the first feature is in direct contact with the second feature, or the first feature is in indirect contact with the second feature via an intermediate medium. Furthermore, the expression the first feature being "over", "above" and "on top of" the second feature may be the case that the first feature is directly above or obliquely above the second feature, or only means that the level of the first feature is higher than that of the second feature. The expression the first feature being "under", "below" and "beneath" the second feature may be the case that the first feature is directly below or obliquely below the second feature, or only means that the level of the first feature is less than that of the second feature.

Unless otherwise defined, all technical and scientific terms used herein have the same meaning as a skilled person in the art would understand. The terminology used in the description of the present disclosure is for the purpose of describing particular embodiments and is not intended to limit the disclosure. The term "or/and" as used herein includes any and all combinations of one or more of the associated listed items.

A conventional seed crystal lifting device of a single crystal furnace needs to drive a cable pipe to move horizontally toward one side while rotating, so as to wind, store and lift a seed crystal rope. A center of gravity of the entire conventional seed crystal lifting device shifts to one side and the cable pipe moves horizontally at the same time, thus reducing stability of the conventional seed crystal lifting device and lowering quality of products. For the conventional seed crystal lifting device in the related art, a counterweight structure such as a counterweight, a direction and a speed of movement of which in synchronization with those of the cable pipe, can be provided to compensate for movement of the cable pipe, so as to ensure central balance and the stability of the conventional seed crystal lifting device. However, an overall size and weight of the conventional seed crystal lifting device can be greater due to the counterweight structure, and the conventional seed crystal lifting device is difficult to transport and assemble.

To solve the above problem, referring to FIG. 1 to FIG. 9, a seed crystal lifting device 100 is provided in the present disclosure, and the seed crystal liming device 100 can ensure the stability during operation without increasing the overall size and weight thereof.

Figure 2:
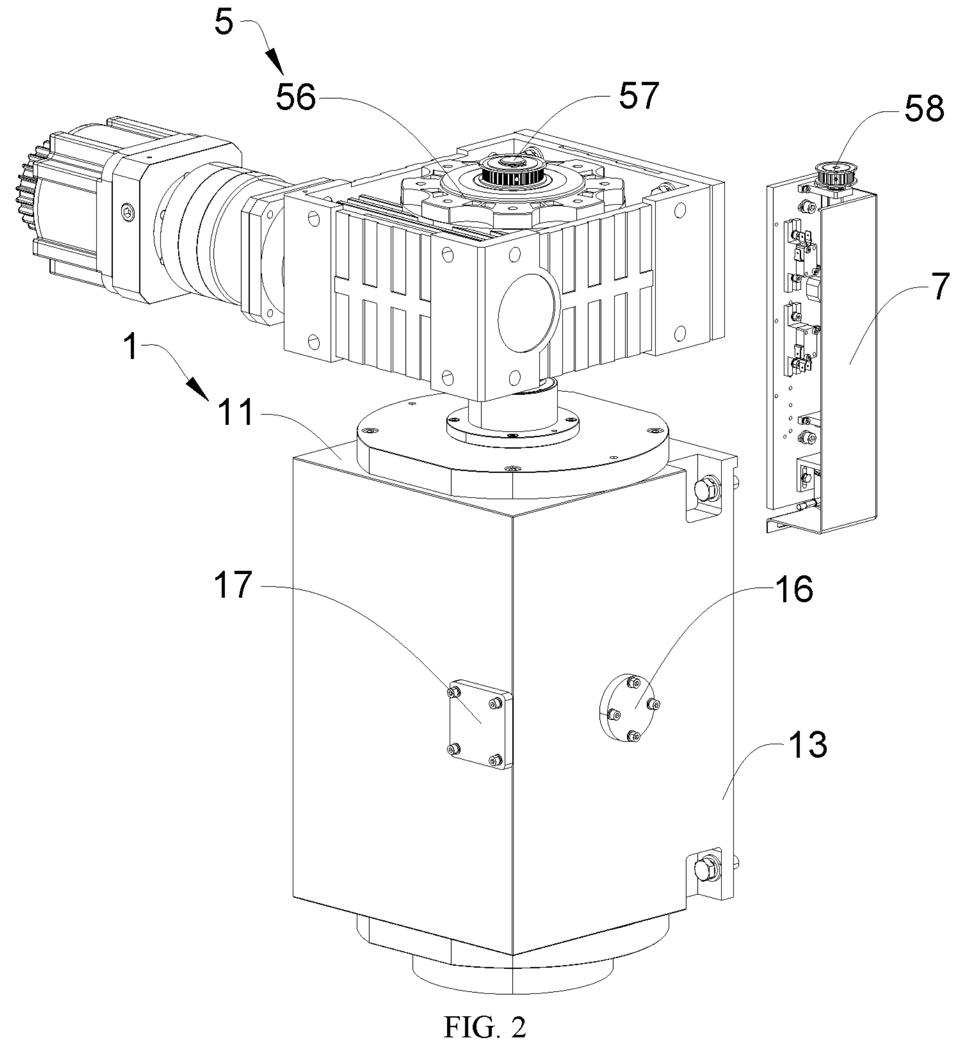
FIG. 2 is a perspective view of the seed crystal lifting device of FIG. 1 from another angle of view.
Figure 3:
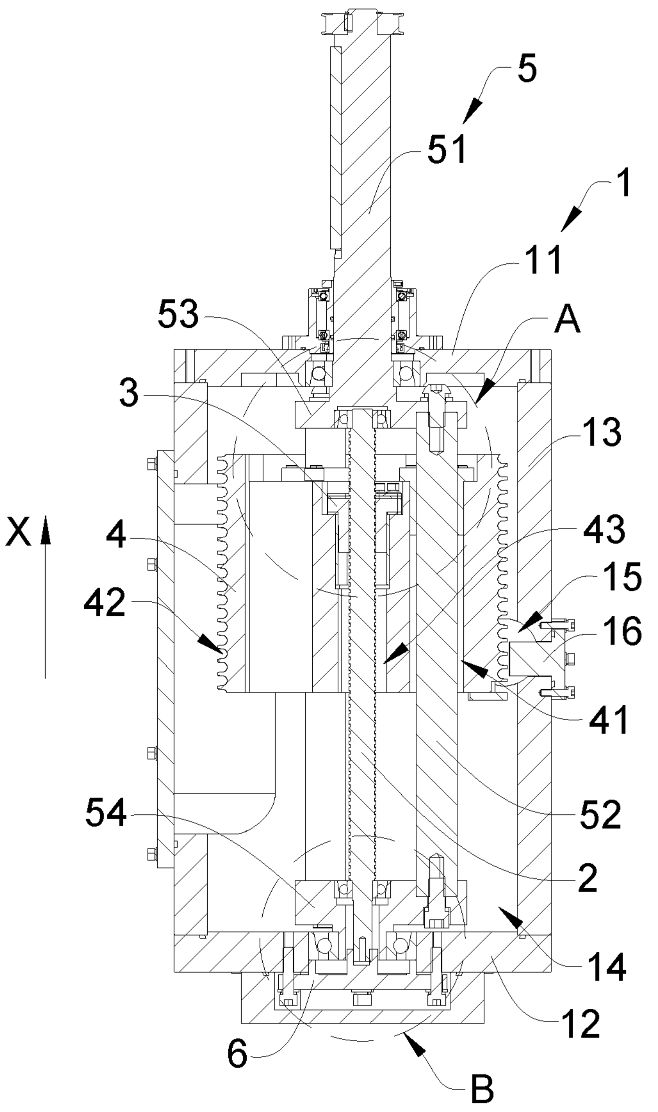
FIG. 3 is a sectional schematic view of a seed crystal lifting device according to one or more embodiments of the present disclosure.

Specifically, referring to FIG. 1 to FIG. 3, the seed crystal lifting device 100 is applied in a single crystal furnace 200, and includes a frame 1, a cable pipe 4, and a driving component 5. The frame 1 is disposed at a top of the single crystal furnace 200. The cable pipe 4 is movably disposed on the frame 1, and a peripheral wall of the cable pipe 4 is configured to allow a seed crystal rope to wind. The driving component 5 is disposed on the frame 1 and configured to drive the cable pipe 4 to rotate around an axis of the cable pipe 4 and slide along a vertical direction at the same time, to wind and lift the seed crystal rope.

As described above, in the conventional seed crystal lifting device of the related art, the cable pipe moves horizontally toward one side and stores and lifts the seed crystal rope at the same time, so that the center of gravity of the entire conventional seed crystal lifting device shifts to one side, thus reducing stability of the conventional seed crystal lifting device and lowering quality of products. In some conventional seed crystal lifting devices, the counterweight structure can be provided to ensure stability of the conventional seed crystal lifting devices. However, an overall size and weight of the conventional seed crystal lifting device can be greater due to the counterweight structure, and the conventional seed crystal lifting device is difficult to transport and assemble. In the seed crystal lifting device 100 provided in the present disclosure, the driving component 5 can drive the cable pipe 4 to rotate around the axis of the cable pipe 4 and drive the cable pipe 4 to slide along the vertical direction, i.e., +X-axis directions shown in FIG. 1 at the same time, so as to lift and wind the seed crystal rope around an outer surface of the cable pipe 4. When the cable pipe 4 slides along the vertical direction, a center of gravity of the cable pipe 4 is always constant along a horizontal direction. In this way, the stability of the seed crystal lifting device can prevent from reducing since the center of gravity of the entire seed crystal lifting device moves horizontally toward one side, thus ensuring quality of products. In addition, the seed crystal lifting device 100 can achieve stability without the additional counterweight structure, thus avoiding increasing the overall size and weight of the seed crystal lifting device, and facilitating transportation and assembling.

Referring to FIG. 3, the seed crystal lifting device 100 can further include a screw 2 and a nut 3. The screw 2 can be fixed on the frame 1 and extend along the vertical direction. The nut 3 can be sheathed on the screw 2 and matched with the screw 2 via a helix, and the cable pipe 4 can be fixed to the nut 3 along a same axis. Since the cable pipe 4 is disposed along the same axis with the nut 3 and the nut 3 is disposed along the same axis with the screw 2, the cable pipe 4 can be disposed along the same axis with the screw 2, and the driving component 5 can drive the cable pipe 4 to rotate around an axis of the screw 2. When the driving component 5 drives the cable pipe 4 to rotate around the axis of the screw 2, the nut 3 can rotate with the cable pipe 4 around the screw 2. Since the nut 3 is matched with the screw 2 via the helix, the nut 3 can rotate and drive the cable pipe 4 to slide along the vertical direction of the screw 2 at the same time. In this way, it can be achieved that the cable pipe 4 can rotate around the axis of the screw 2 and slide along the vertical direction of the screw 2 at the same time.

In some embodiments, the driving component 5 can include a splined shaft. The splined shaft can be inserted in the screw 2, and the screw 2 can protrude from an end of the cable pipe 4. A length of a part of the screw 2 protruding from the cable pipe 4 is limited by a stroke of the cable pipe 4 and a thickness of the nut 3. The spline shaft can drive the cable pipe 4 to rotate around the axis of the screw 2, and can further drive the cable pipe 4 to slide along the vertical direction via a cooperation of the screw 2 and the nut 3. However, due to a larger size of the part of the screw 2 protruding from the cable pipe 4, an overall size and weight of the seed crystal lifting device may be increased. In addition, a diameter of the screw 2 is greater, so that wear between the screw 2 and the nut 3 can be serious, which is easy to produce metal contamination.

In an illustrated embodiment, the driving component 5 can include a driving shaft 51 and a guide member 52, and the guide member 52 can extend along the vertical direction. The cable pipe 4 can be provided with a guide hole 41 through the cable pipe 4 along the vertical direction eccentrically. The guide member 52 can be slidably inserted in the guide hole 41, and the driving shaft 51 can be configured to drive the guide member 52 to further drive the cable pipe 4 and the nut 3 to rotate around the screw 2. In this way, the screw 2 does not need to protrude from the end of the cable pipe 4. Furthermore, both of a length of the screw 2 and a length of the guide member 52 along the vertical direction can be equal to or slightly greater than a sum of the stroke of the cable pipe 4 and a length of the cable pipe 4 along the vertical direction, as long as the cable pipe 4 can slide along the vertical direction of the screw 2, thus avoiding increasing the overall size and weight of the seed crystal lifting device.

The cable pipe 4 can be further provided with an avoidance hole 43 through the cable pipe 4 along the vertical direction. The nut 3 can be fixed to an inner wall of the avoidance hole 43 by means of screws, buckles, gluing, etc. The screw 2 can be inserted into the avoidance hole 43, so that the cable pipe 4 can slide along the vertical direction of the screw 2. An inner diameter of the avoidance hole 43 can be slightly greater than that of the screw 2, thus avoiding a contact between the inner wall of the avoidance hole 43 and the screw 2 to affect movement of the cable pipe 4. A length of the nut 3 along the vertical direction (i.e., the thickness of the nut 3) can be less than the length of the cable pipe 4 along the vertical direction, thus reducing a contact area between the nut 3 and the screw 2 and facilitating the movement of cable pipe 4.

Referring to FIG. 3, the frame 1 can include a first bracket 11 and a second bracket 12 disposed at both ends of the screw 2 along the vertical direction, respectively. The frame 1 can further include a side wall 13 configured for connecting the first bracket 11 and the second bracket 12. The first bracket 11, the second bracket 12 and the side wall 13 can be enclosed to form a lift cavity 14, and the cable pipe 4 can be movably disposed inside the lift cavity 14, so as to protect the seed crystal rope.

Referring to FIG. 3, and FIG. 6 to FIG. 7*b*, the frame 1 can further include a line inlet 15 provided on the side wall 13. The peripheral wall of the cable pipe 4 can be provided with a spiral groove 42 which can be configured to allow the seed crystal rope to wind. The seed crystal rope can enter the lift cavity 14 through the line inlet 15 and wind around the spiral groove 42. It can be understood that since a position of the line inlet 15 is always fixed, and the seed crystal rope can always be wound onto the spiral groove 42 via an intersection denoted as C between a helix of the spiral groove 42 and a busbar thereof, that is, a moving speed of the intersection C relative to the screw 2 can be denoted as V3, and the moving speed V3 satisfies the following formula: V3=0.

Figure 7A:
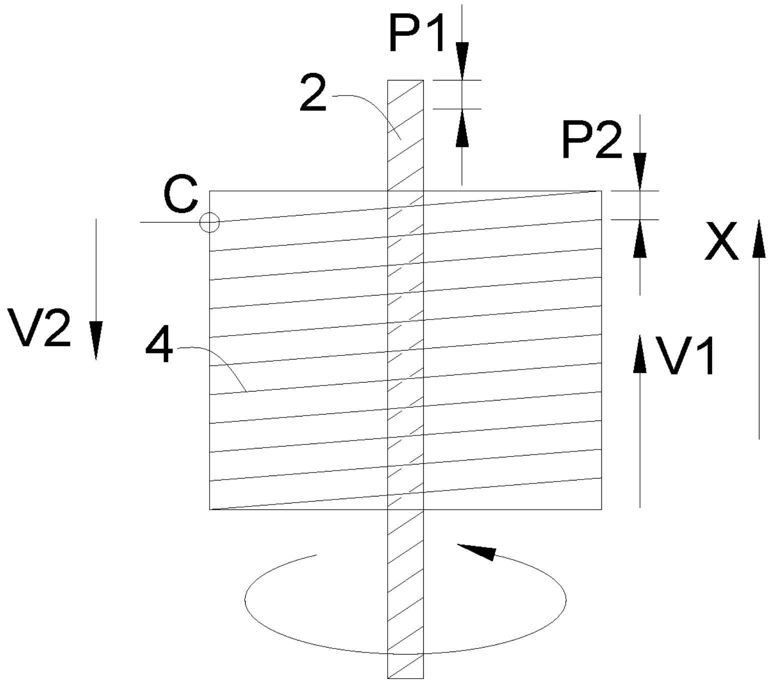
FIG. 7*a* is a first schematic view of a direction of motion of a cable pipe according to one or more embodiments of the present disclosure.
Figure 7B:
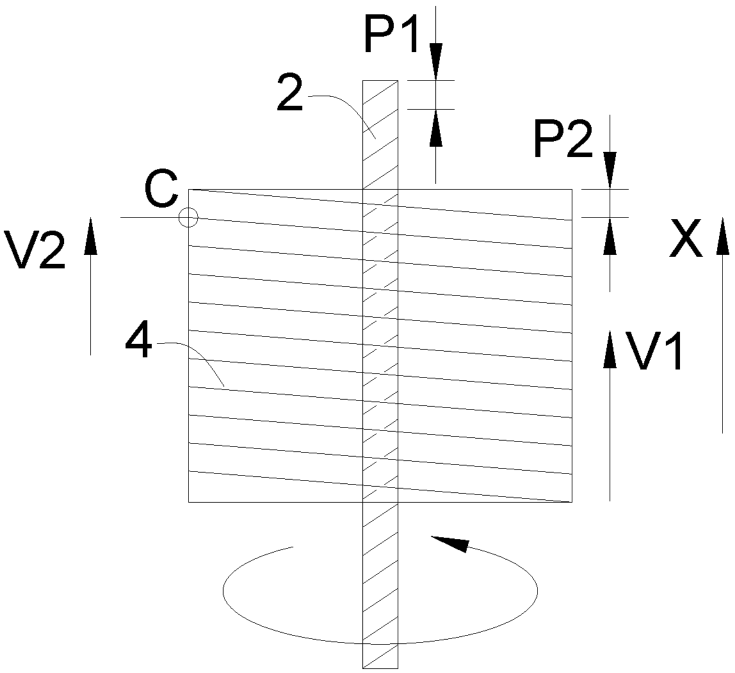
FIG. 7*b* is a second schematic view of a direction of motion of a cable pipe according to one or more embodiments of the present disclosure.

Referring to FIG. 7*b*, a helix of the screw 2 can be right-handed and a pitch thereof can be denoted as P1, and the helix of the spiral groove 42 can be left-handed and a pitch thereof can be denoted as P2. When the cable pipe 4 rotates counterclockwise, the cable pipe 4 can slide relative to the screw 2 at a speed denoted as V1 along a +X-axis direction, and the intersection C between the helix of the spiral groove 42 and the busbar thereof can slide relative to the cable pipe 4 at a speed denoted as V2 along the +X-axis direction. In this way, V1 and V2 satisfy the following formulas: V1=nP1>0, and V2=nP2>0. The moving speed V3 of the intersection C relative to the screw 2 can satisfy the following formula: V3=V1+V2>0. Therefore, when a spiral of the helix of the spiral groove 42 is opposite to that of the helix of the screw 2, the spiral groove 42 cannot properly allow the seed crystal rope to wind.

Referring to FIG. 7*a*, the helix of the screw 2 can be right-handed and the pitch thereof can be denoted as P1, and the helix of the spiral groove 42 can be right-handed and the pitch thereof can be denoted as P2. When cable pipe 4 rotates counterclockwise, the cable pipe 4 can slide relative to the screw 2 at the speed V1 along the +X-axis direction, and the intersection C between the helix of the spiral groove 42 and the busbar thereof can slide relative to the cable pipe 4 at the speed V2 along the −X-axis direction. In this way, V1 and V2 satisfy the following formulas: V1=nP1>0, and V2=−nP2<0. When P1 is equal to P2, V1 is equal to −V2, and the moving speed V3 of the intersection C relative to the screw 2 can satisfy the following formula: V3=V1+V2=0. Therefore, when the spiral of the helix of the spiral groove 42 is the same as that of the helix of the screw 2 and the pitch of the helix of the spiral groove 42 is the same as that of the helix of the screw 2, the spiral groove 42 can properly allow the seed crystal rope to wind, thus ensuring a winding effect of the seed crystal rope. When cable pipe 4 rotates clockwise, the cable pipe 4 can slide relative to the screw 2 to reset along the −X-axis direction.

In other embodiments, both the helix of the screw 2 and the helix of the spiral groove 42 can be left-handed. In this way, when the cable pipe 4 rotates clockwise, the cable pipe 4 can slide relative to the screw 2 along the +X-axis direction, and when the cable pipe 4 rotates counterclockwise, the cable pipe 4 can slide relative to the screw 2 to reset along the −X-axis direction.

Referring to FIG. 1 to FIG. 3, the frame 1 can further include a block 16 protruding from an inside of the side wall 13. A spacing between the block 16 and a bottom wall of the spiral groove 42 can be equal to or slightly greater than a diameter of the seed crystal rope, so that the seed crystal rope can be pressed within the spiral groove 42 of the cable pipe 4 by the block 16 while passing beside the block 16. A center of the block and a center of the line inlet can be located in the same horizontal plane. In this way, after the seed crystal rope enters the frame 1 through the line inlet 15, the seed crystal rope can be pressed within the spiral groove 42 by the block 16, thus improving the winding effect of the seed crystal rope on the cable pipe 4. The side wall 13 of the frame 1 can further be provided with an access port 17, internal components of the frame 1 can be repaired through the access port 17. A center of access port 17, the center of the block 16 and the center of the line inlet 15 can be located in the same horizontal plane, thus facilitating operation.

Figure 4:
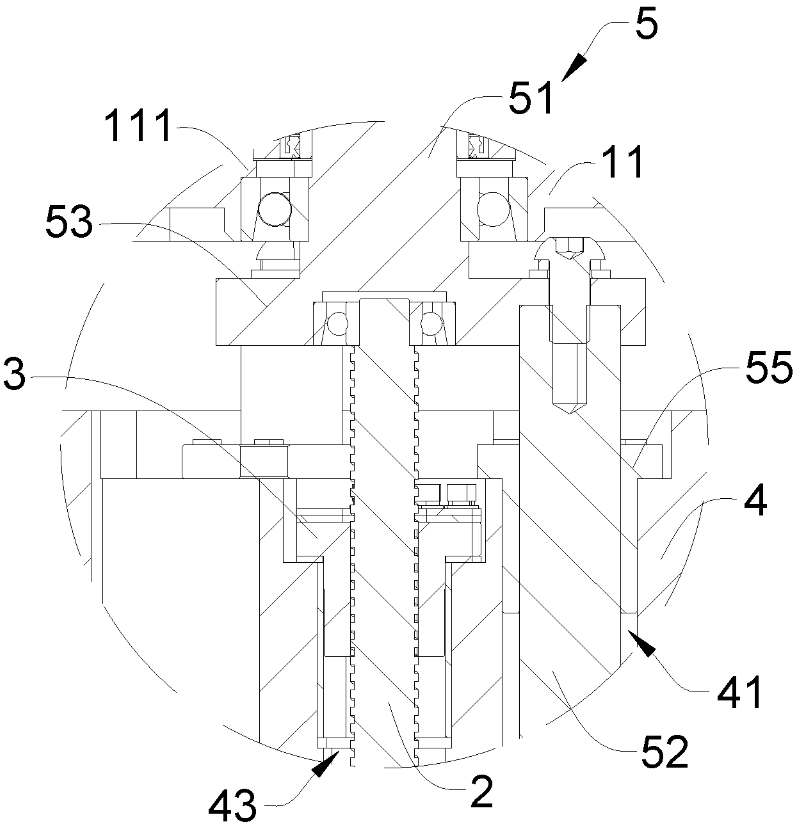
FIG. 4 is an enlargement view of portion "A" of FIG. 3.
Figure 8:
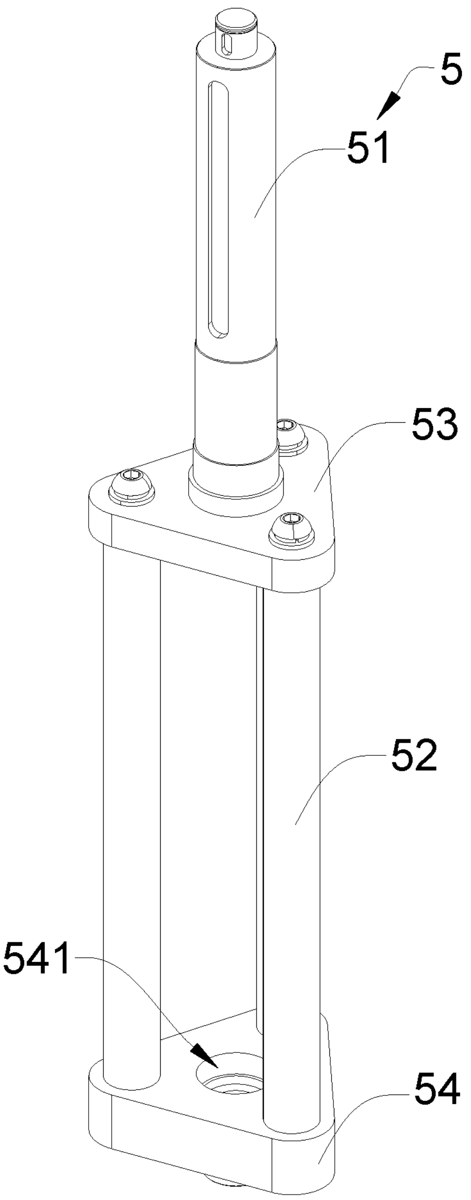
FIG. 8 is a perspective view of a driving component according to one or more embodiments of the present disclosure.
Figure 9:
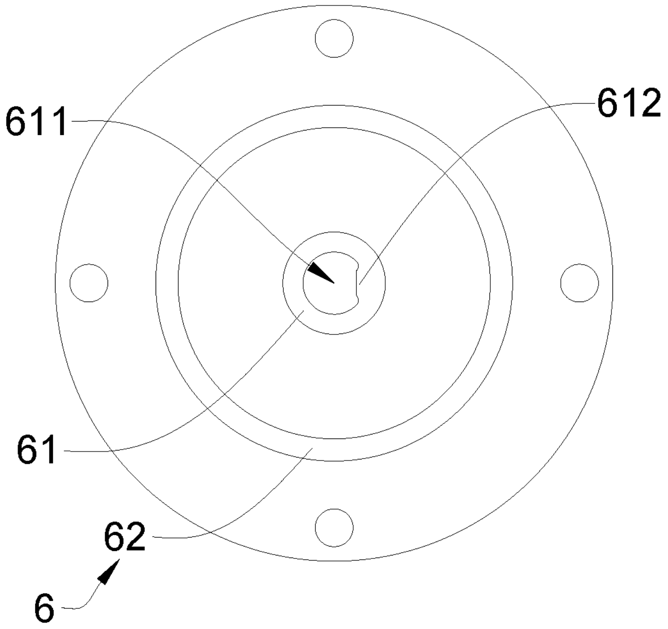
FIG. 9 is a top view of a limiting member according to one or more embodiments of the present disclosure.

Referring to FIG. 4 and FIG. 8, the driving component 5 can further include a first connecting member 53 disposed at an end of the guide member 52 along the vertical direction. The driving shaft 51 can be disposed at an end of the first connecting member 53 away from the guide member 52, and an axis of the driving shaft 51 and an axis of the screw 2 can be coaxial. The first connecting member 53 can be rotatably connected to the first bracket 11 by a bearing, and an axis of a rotation shaft of the first connecting member 53 and the axis of the screw 2 can be coaxial. The driving shaft 51 can penetrate through the first bracket 11 from an outside of the frame 1 and be connected to the first connecting member 53. An end of the screw 2 proximal to the first connecting member 53 can be separated from the first connecting member 53, or rotatably connected to the first connecting member 53 by a bearing. The driving shaft 51 can drive the first connecting member 53 to further drive the guide member 52 to rotate around the screw 2, so as to connect and support the driving shaft 51 and the guide member 52 via the first connecting member 53.

Figure 5:
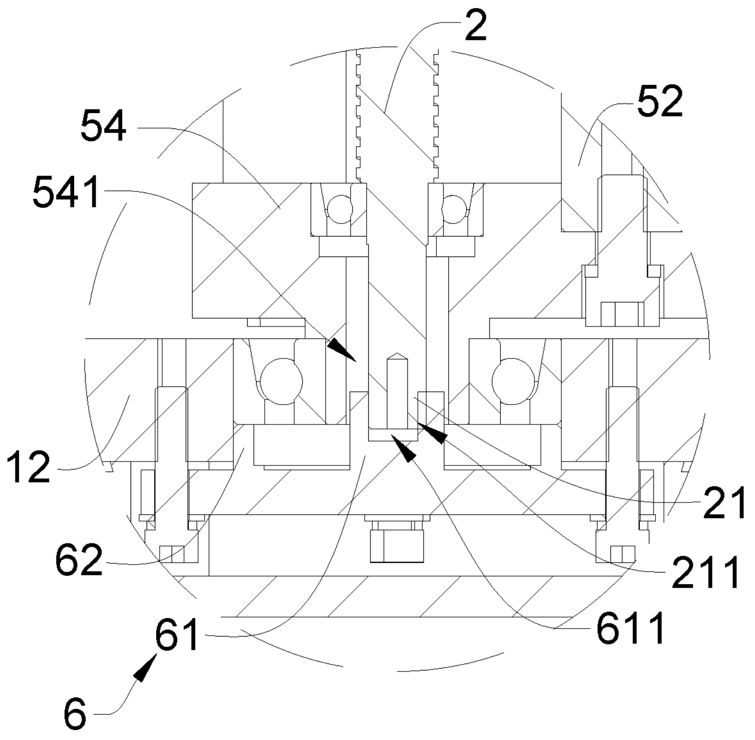
FIG. 5 is an enlargement view of portion "B" of FIG. 3.

Referring to FIG. 5 and FIG. 8, the driving component 5 can further include a second connecting member 54 disposed at an end of the guide member 52 away from the first connecting member 53, the second connecting member 54 can be provided with a hole 541 through the second connecting member 54 along the vertical direction, and the screw 2 can be rotatably inserted in the hole 541. The second connecting member 54 can be rotatably connected to the second bracket 12 by a bearing, and an axis of a rotation shaft of the second connecting member 54 and the axis of the screw 2 can be coaxial. An end of the screw 2 inserted through the hole 541 can be fixed to the second connecting member 54, and the screw 2 can be rotatably connected to an inner wall of the hole 541 by a bearing. Stability of the guide member 52 can be improved with the second connecting member 54, thus preventing the guide member 52 from oscillating to affect the movement of the cable pipe 4.

Two ends of the guide member 52 can be connected to the first connecting member 53 and the second connecting member 54 by means of screws, buckles, gluing, splicing, etc., respectively.

Figure 6:
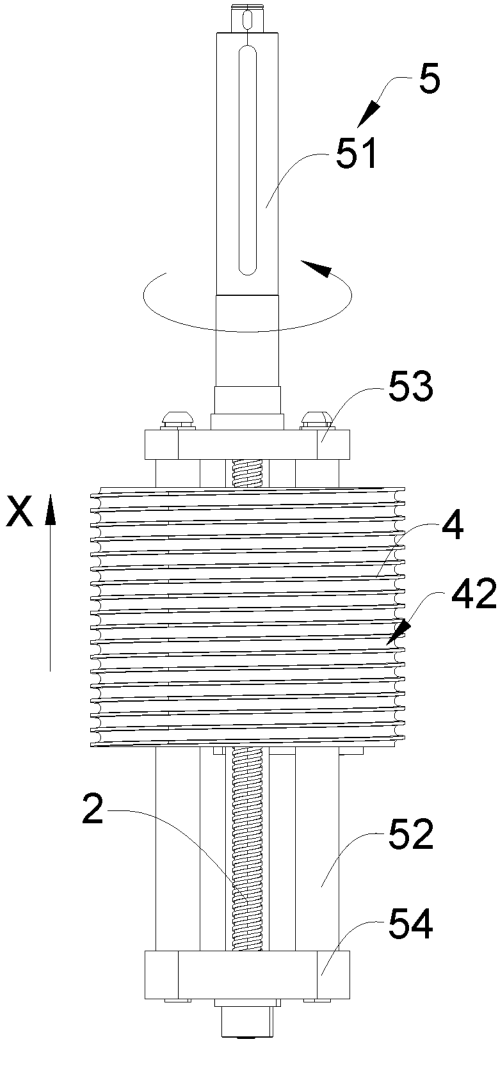
FIG. 6 is a schematic view of a cable pipe in a motion state according to one or more embodiments of the present disclosure.

The number of the guide member 52 may be one, two, three or more. A plurality of the guide members 52 can be arranged at intervals, and each guide member 52 can be eccentric with the screw 2 to avoid interference among the guide members 52 or between the guide members 52 and the screw 2. Referring to FIG. 6, in an illustrated embodiment, the number of the guide member 52 can be three, three guide members 52 can be arranged at intervals along a circumference direction of the screw 2. Alternatively, three guide members 52 can be evenly arranged at intervals along the circumference direction of the screw 2, so as to ensure the stability and balance of the guide members 52 when driving the cable pipe 4 to rotate relative to the screw 2, thus avoiding reducing the overall stability of the seed crystal lifting device due to deflection of a center of gravity of the driving component 5. In addition, the three guide members 52 can be provided to prevent production and mounting processes from being too complex.

Referring to FIG. 4, the driving component 5 can further include a guide sleeve 55 embedded on an inner wall of the guide hole 41, the guide sleeve 55 can be slidably connected to the guide member 52. The guide sleeve 55 can be fixed to the inner wall of the guide hole 41 by means of screws, buckles, gluing, etc. An inner diameter of the guide hole 41 can be slightly greater than that of the guide member 52, so as to avoid an excessive friction force between the inner wall of the guide hole 41 and the guide member 52, thus causing the cable pipe 4 to slide difficult, and resulting in the cable pipe 4 and the guide member 52 being easily damaged. The guide sleeve 55 can avoid a direct contact between the inner wall of guide hole 41 and guide member 52. Moreover, a length of the guide sleeve 55 along the vertical direction can be less than a length of the cable pipe 4 along the vertical direction, so as to reduce a contact area between the guide sleeve 55 and the guide member 52, thereby reducing the friction force. Therefore, the cable pipe 4 can slide easily to avoid damage to the cable pipe 4 and the guide member 52. In addition, the guide sleeve 55 can also play a role of supporting to prevent the cable pipe 4 from swinging along a radial direction thereof when rotating or sliding, thereby improving the stability of the cable pipe 4.

Referring to FIG. 1 and FIG. 2, since the inside of the frame 1 needs to be vacuumized during a process of lifting seed crystal, it cannot be observed or detected that the specific number of turns and position of the cable pipe 4 inside frame 1. Therefore, the driving component 5 can further include a driving member 56 disposed outside the frame 1, the driving member 56 can be configured to drive the driving shaft 51. The seed crystal lifting device 100 can further include a limiting component 7 disposed outside the frame 1, and the driving member 56 can be further configured to drive the limiting component 7 to rotate in synchronization with the driving shaft 51. In the illustrated embodiment, the driving member 56 can include a drive motor, and both ends of the drive motor can be provided with an output shaft, respectively. One output shaft can be connected to the driving shaft 51, the other output shaft can be provided with a first pulley 57, and the limiting component 7 can be provided with a second pulley 58 driven by the first pulley 57 via a belt (not shown). The drive motor can drive the driving shaft 51 to rotate and drive the first pulley 57 to rotate synchronously, the first pulley 57 can drive the second pulley 58 to rotate synchronously via the belt, and the second pulley 58 can drive the limiting component 7 to rotate synchronously. In this way, the limiting component 7 can rotate in synchronization with the cable pipe 4, it can be observed or detected that the specific number of turns and position of the cable pipe 4 inside frame 1 by the limiting component 7, which is convenient for controlling the cable pipe 4.

Referring to FIG. 5 to FIG. 9, the seed crystal lifting device 100 can further include a limiting member 6 disposed on the second bracket 12 of the frame 1 by means of screws, buckles, gluing, etc. The limiting member 6 can include a first limiting portion 61 configured to circumferentially limit the screw 2 and a second limiting portion 62 configured to axially limit the driving component 5. The screw 2 can be fixed to the second bracket 12 by the limiting member 6. Furthermore, the first limiting portion 61 can be provided to prevent the screw 2 from shifting or swinging, thus improving stability of the screw 2. The second limiting portion 62 can be provided to limit the driving component 5 to move vertically, thus improving stability of driving component 5. Therefore, the stability of the cable pipe 4 during movement can be improved. In other embodiments, the limiting member 6 may also include the first limiting portion 61 or the second limiting portion 62.

The first limiting portion 61 can be provided with a limiting hole 611, the screw 2 can be provided with a limiting end 21, and the limiting end 21 can be sleeved on and fixed to the limiting hole 611. In the illustrated embodiment, an inner wall of the limiting hole 611 can be provided with a protrusion 612, and the limiting end 21 can be provided with a groove 211 corresponding to the protrusion 612. The limiting end 21 can be inserted into the limiting hole 611 after the groove 211 is matched with the protrusion 612, thus avoiding rotation of the screw 2 and further improving the stability of the screw 2. The second limiting portion 62 can be annular-shaped, the annular second limiting portion 62 can abut against an outer ring of a bearing between the second connecting member 54 and the second bracket 12, so as to limit the driving component 5 to move vertically. In addition, the first bracket 11 can be provided with a step portion 111 which abuts against an outer ring of a bearing between the first connecting member 53 and the first bracket 11, and the step portion 111 can also limit the driving component 5 to move vertically, thus improving the stability of driving component 5.

Figure 10:
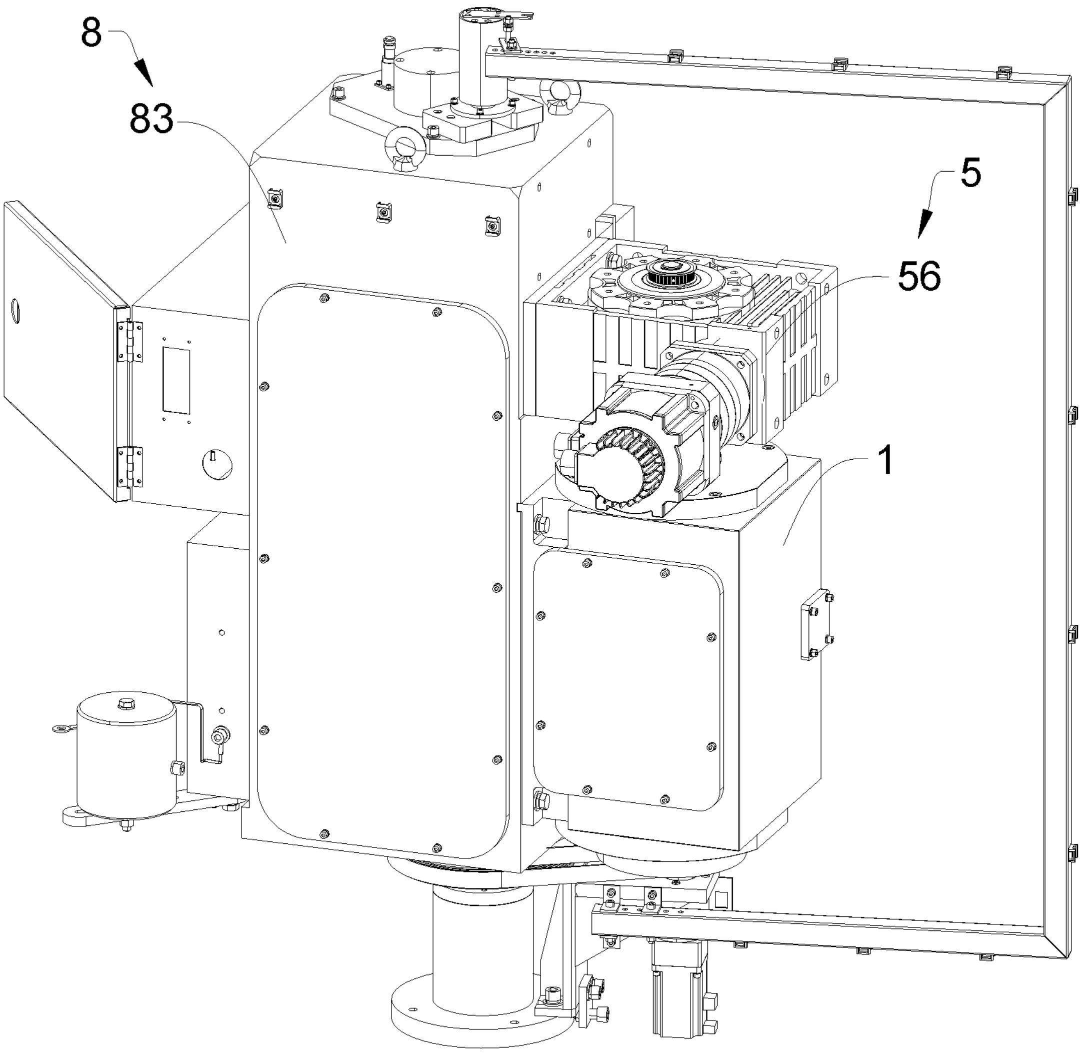
FIG. 10 is a perspective view of a seed crystal lifting device according to one or more embodiments of the present disclosure.
Figure 11:
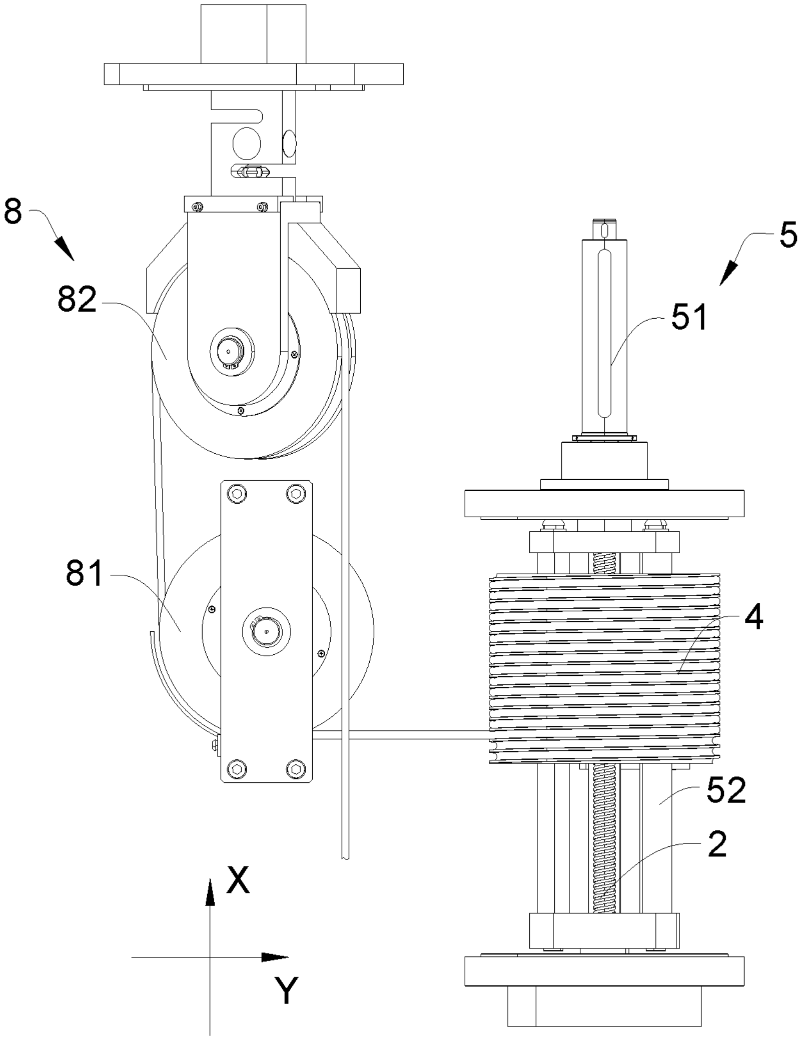
FIG. 11 is a perspective view of a guide component and a cable pipe according to one or more embodiments of the present disclosure.

Referring to FIG. 10 and FIG. 11, the seed crystal lifting device 100 can further include a guide component 8 located at a side of the cable pipe 4 along the horizontal direction (i.e., ±Y-axis directions shown in FIG. 11), and the guide component 8 can be configured to guide the seed crystal rope extending along the vertical direction (i.e., ±X-axis directions shown in FIG. 11) to extend along the horizontal direction to the cable pipe. The guide component 8 can guide the seed crystal rope extending along the vertical direction to extend along the horizontal direction, thus making it easy to wind the seed crystal rope onto the cable pipe 4. Furthermore, the guide component 8 is located at the side of the cable pipe 4 along the horizontal direction, so that the size of the seed crystal lifting device 100 along the vertical direction would not be increased, thus avoiding increasing the overall size of the seed crystal lifting device along the vertical direction.

Referring to FIG. 10 to FIG. 11, the guide component 8 can include a first sheave 81, a second sheave 82, and a housing 83 sheathed on the first sheave 81 and the second sheave 82. The first sheave 81 and the second sheave 82 can be arranged at intervals along the vertical direction. The first sheave 81 and the second shave 82 can rotate about two horizontal axes, respectively. The seed crystal rope can be sequentially wound on the first sheave 81 and the second sheave 82 after extending into the housing 83 along a +X-axis direction. Since the seed crystal rope can be sequentially wound on the first sheave 81 and the second sheave 82, an extension direction of the seed crystal rope can be changed. The seed crystal rope can finally extend into the frame 1 along the +Y-axis direction. The seed crystal rope can be wound onto the peripheral wall of the cable pipe 4 by rotation of the cable pipe 4.

Figure 12:
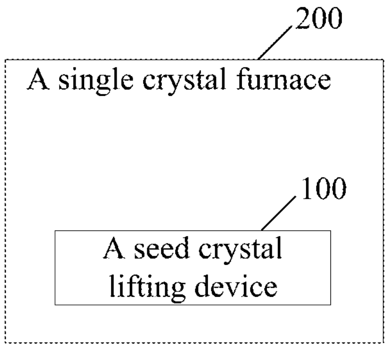
FIG. 12 is a schematic view of a single crystal furnace according to one or more embodiments of the present disclosure.

Referring to FIG. 12, the present disclosure further provides a single crystal furnace 200, which includes the above seed crystal lifting device 100.

The technical features of the above-mentioned embodiments can be combined arbitrarily. In order to make the description concise, not all possible combinations of the technical features are described in the embodiments. However, as long as there is no contradiction in the combination of these technical features, the combinations should be considered as in the scope of the present disclosure.

The above-described embodiments are merely illustrative of several embodiments of the present disclosure, and the description thereof is relatively specific and detailed, but is not to be construed as limiting the scope of the disclosure. It should be noted that a number of variations and modifications may be made by those skilled in the art without departing from the spirit and scope of the disclosure. Therefore, the scope of the disclosure should be determined by the appended claims.

What is claimed is:

1. A seed crystal lifting device, applied in a single crystal furnace, comprising a frame, a cable pipe, and a driving component;

wherein the frame is disposed at a top of the single crystal furnace;

the cable pipe is movably disposed on the frame, and a peripheral wall of the cable pipe is provided with a spiral groove which is configured to allow a seed crystal rope to wind, a helix of the spiral groove is in a same direction of rotation as the helix of the screw, and a pitch of the spiral groove is equal to a pitch of the screw;

a screw and a nut, wherein the screw is fixed on the frame and extends along the vertical direction, the nut is sheathed on the screw and matched with the screw via a helix, and the cable pipe is fixed to the nut along an axis of the cable pipe; and the driving component is disposed on the frame and configured to drive the cable pipe to rotate around the axis of the cable pipe and slide along a vertical direction at the same time, to wind and lift the seed crystal rope, wherein the driving component comprises a driving shaft and a guide member, the guide member extends along the vertical direction, and the cable pipe is provided with a guide hole through the cable pipe along the vertical direction eccentrically, and the guide member is slidably inserted in the guide hole, and the driving shaft is configured to drive the guide member to further drive the cable pipe to rotate around the screw.

2. The seed crystal lifting device of claim 1, wherein the frame comprises a side wall and a block protruding from an inside of the side wall, and the block is configured to press the seed crystal rope to the cable pipe; and the side wall of the frame is provided with a line inlet, a center of the block and a center of the line inlet are located in a same horizontal plane.

3. The seed crystal lifting device of claim 1, wherein the driving component further comprises a first connecting member disposed at an end of the guide member along the vertical direction, the driving shaft is disposed at an end of the first connecting member away from the guide member, and an axis of the driving shaft and an axis of the screw are coaxial.

4. The seed crystal lifting device of claim 3, wherein the driving component further comprises a second connecting member disposed at an end of the guide member away from the first connecting member, the second connecting member is provided with a hole through the second connecting member along the vertical direction, and the screw is rotatably inserted in the hole.

5. The seed crystal lifting device of claim 1, wherein the driving component further comprises a driving member disposed outside the frame, the driving member is configured to drive the driving shaft; and the seed crystal lifting device further comprises a limiting component disposed outside the frame, and the driving member is further configured to drive the limiting component to rotate in synchronization with the driving shaft.

6. The seed crystal lifting device of claim 1, wherein the driving component further comprises a guide sleeve embedded on an inner wall of the guide hole, the guide sleeve is slidably connected to the guide member, and a length of the guide sleeve along the vertical direction is less than a length of the cable pipe along the vertical direction.

7. The seed crystal lifting device of claim 1, further comprising either or both of the following structures:

the seed crystal lifting device further comprises a limiting member disposed in the frame, and the limiting member comprises a first limiting portion configured to fix the screw; and the seed crystal lifting device further comprises a limiting member disposed in the frame, and the limiting member comprises a second limiting portion configured to axially limit the driving component.

8. The seed crystal lifting device of claim 1, further comprising a guide component located at a side of the cable pipe along a horizontal direction, and the guide component is configured to guide the seed crystal rope extending along the vertical direction to extend along the horizontal direction to the cable pipe.

* * * * *